(12) United States Patent
Ran et al.

(10) Patent No.: US 10,818,459 B2
(45) Date of Patent: Oct. 27, 2020

(54) MINIATURE CIRCUIT BREAKER, CONTROL METHOD THEREOF, AND CONTROL SYSTEM THEREOF

(71) Applicant: Huawei Technologies Co., Ltd., Shenzhen (CN)

(72) Inventors: Xiaoke Ran, Dongguan (CN); Xiangmin Ma, Dongguan (CN); Wei Guo, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/362,148

(22) Filed: Mar. 22, 2019

(65) Prior Publication Data
US 2019/0295797 A1 Sep. 26, 2019

(30) Foreign Application Priority Data

Mar. 22, 2018 (CN) .......................... 2018 1 0242213

(51) Int. Cl.
*H01H 71/04* (2006.01)
*G01K 3/00* (2006.01)
(Continued)

(52) U.S. Cl.
CPC ............. *H01H 71/04* (2013.01); *G01K 3/005* (2013.01); *G01R 19/10* (2013.01); *G08B 21/182* (2013.01);
(Continued)

(58) Field of Classification Search
CPC .... H01H 71/04; H01H 37/02; H01H 11/0062; H01H 71/08; H01H 71/125; H01H 71/24;
(Continued)

(56) References Cited

U.S. PATENT DOCUMENTS

| | | | | |
|---|---|---|---|---|
| 4,996,646 A | * | 2/1991 | Farrington | ............... H02H 3/00 307/132 E |
| 5,083,081 A | | 1/1992 | Barrault et al. | |

(Continued)

FOREIGN PATENT DOCUMENTS

| | | |
|---|---|---|
| CN | 101371414 A | 2/2009 |
| CN | 103996575 A | 8/2014 |

(Continued)

OTHER PUBLICATIONS

Foreign Communication From a Counterpart Application, European Application No. 19164649.6, Partial European Search Report dated Aug. 30, 2019, 7 pages.

(Continued)

*Primary Examiner* — Hung T Nguyen
(74) *Attorney, Agent, or Firm* — Conley Rose, P.C.

(57) ABSTRACT

A miniature circuit breaker, a control method thereof, and a control system thereof, where the miniature circuit breaker includes a circuit breaker body and a current detection unit. The circuit breaker body and the current detection unit are located in respectively independent cavities in the circuit breaker and are electrically coupled to each other. After a current that flows from one end of the circuit breaker body flows through the current detection unit, the current flows into another end of the circuit breaker body. The current detection unit includes a voltage drop detection assembly and a signal output terminal. The voltage drop detection assembly includes a first voltage sampling point and a second voltage sampling point, where the first voltage sampling point and the second voltage sampling point are coupled to the signal output terminal.

20 Claims, 7 Drawing Sheets

(51) Int. Cl.
| | |
|---|---|
| *G01R 19/10* | (2006.01) |
| *G08B 21/18* | (2006.01) |
| *H01H 71/08* | (2006.01) |
| *H01H 71/24* | (2006.01) |
| *H01H 71/40* | (2006.01) |
| *H05K 1/18* | (2006.01) |
| *H01H 83/14* | (2006.01) |
| *H01H 11/00* | (2006.01) |
| *H01H 71/12* | (2006.01) |
| *G01R 1/20* | (2006.01) |

(52) U.S. Cl.
CPC ....... *G08B 21/185* (2013.01); *H01H 11/0062* (2013.01); *H01H 71/08* (2013.01); *H01H 71/125* (2013.01); *H01H 71/24* (2013.01); *H01H 71/40* (2013.01); *H01H 83/144* (2013.01); *H05K 1/181* (2013.01); *G01R 1/203* (2013.01); *H01H 2011/0068* (2013.01); *H05K 2201/10053* (2013.01); *H05K 2201/10151* (2013.01); *H05K 2201/10272* (2013.01)

(58) Field of Classification Search
CPC .. H01H 83/144; G08B 21/182; G08B 21/185; G01K 3/005; G01R 19/10
USPC .............. 340/521, 635, 636.12, 636.15, 638; 337/3, 13
See application file for complete search history.

(56) References Cited

U.S. PATENT DOCUMENTS

| | | | | |
|---|---|---|---|---|
| 8,237,449 | B2* | 8/2012 | Rallabandi | G01R 19/10 324/522 |
| 10,020,153 | B2* | 7/2018 | Vincent | H02H 3/38 |
| 2005/0219032 | A1 | 10/2005 | Williams et al. | |
| 2011/0291675 | A1 | 12/2011 | Rallabandi et al. | |
| 2014/0118013 | A1 | 5/2014 | Yang et al. | |
| 2015/0070026 | A1 | 3/2015 | Vincent et al. | |

FOREIGN PATENT DOCUMENTS

| | | |
|---|---|---|
| CN | 206293379 U | 6/2017 |
| CN | 206961761 U | 2/2018 |
| EP | 0445048 A1 | 9/1991 |
| EP | 2849196 A1 | 3/2015 |
| FR | 2703506 B1 | 5/1995 |
| WO | 0120634 A2 | 3/2001 |
| WO | 2013102933 A2 | 7/2013 |

OTHER PUBLICATIONS

Machine Translation and Abstract of Chinese Publication No. CN101371414, Feb. 18, 2009, 12 pages.
Machine Translation and Abstract of Chinese Publication No. CN103996575, Aug. 20, 2014, 14 pages.
Machine Translation and Abstract of Chinese Publication No. CN206293379, Jun. 30, 2017, 8 pages.
Machine Translation and Abstract of Chinese Publication No. CN206961761, Feb. 2, 2018, 11 pages.
Machine Translation and Abstract of French Publication No. FR2703506, May 12, 1995, 13 pages.
Foreign Communication From a Counterpart Application, Chinese Application No. 201810242213.3, Chinese Office Action dated Mar. 20, 2019, 11 pages.
Foreign Communication From a Counterpart Application, European Application No. 19164649.6, Extended European Search Report dated Dec. 20, 2019, 13 pages.

* cited by examiner

MINIATURE CIRCUIT BREAKER, CONTROL METHOD THEREOF, AND CONTROL SYSTEM THEREOF

CROSS-REFERENCE TO RELATED APPLICATION

This application claims priority to Chinese Patent Application No. 201810242213.3 filed on Mar. 22, 2018, which is hereby incorporated by reference in its entirety.

TECHNICAL FIELD

This application relates to the field of low-voltage electric devices, and in particular, to a miniature circuit breaker, a control method thereof, and a control system thereof.

BACKGROUND

In a present low-voltage circuit breaker, a current is usually detected using a solution of a transformer, a Hall element, or a Rogowski coil, among which a current transformer is most widely applied. A molded case circuit breaker having a current detection function is used as an example. A current detection unit of the molded case circuit breaker is used as an accessory to be assembled with a circuit breaker body. The current detection unit and the circuit breaker body of the molded case circuit breaker may be isolated from each other. An internal structure of the current detection unit of the molded case circuit breaker includes a current transformer. Alternatively, a current transformer is integrated in the molded case circuit breaker. Current detection functions of both the types of circuit breakers use an induced current generated by the current transformer as an input condition, and an amount of a current that flows through the circuit breaker is displayed using an ammeter or an intelligent controller.

Because a type of current detection element such as the current transformer, the Hall element, and the Rogowski coil has a relatively large volume, the current detection element can be applied only to a molded case circuit breaker and a frame circuit breaker that have a relatively large volume and internal space, making it difficult to integrate such type of current detection element with a miniature circuit breaker. The miniature circuit breaker, due to a small volume and a compact structure, fails to use such type of current detection technology either.

In conclusion, present miniature circuit breakers have no current amount detection function.

SUMMARY

Embodiments of this application provide a miniature circuit breaker, a control method thereof, and a control system thereof, to implement a current detection function of a miniature circuit breaker.

According to a first aspect, this application provides a miniature circuit breaker, including a circuit breaker body and a current detection unit. The circuit breaker body and the current detection unit are located in respectively independent cavities in the circuit breaker and are electrically connected to each other. After a current that flows from one end of the circuit breaker body flows through the current detection unit, the current flows into another end of the circuit breaker body. The current detection unit includes a voltage drop detection assembly and a signal output terminal. The voltage drop detection assembly includes a first voltage sampling point and a second voltage sampling point, where the first voltage sampling point and the second voltage sampling point are connected to the signal output terminal. The signal output terminal is configured to output a voltage difference sampling value, where the voltage difference sampling value is a voltage difference between the first voltage sampling point and the second voltage sampling point. The current detection unit in this application includes the elements of the voltage drop detection assembly and the signal output terminal, and a connection relationship between the elements and a connection relationship between the elements and the circuit breaker body enable the current detection unit in this application to implement through-current with the circuit breaker body, detect a voltage difference generated when the current detection unit is current-through, and output the voltage difference to the outside to calculate, based on the voltage difference, an amount of a current that flows through the current detection unit. The current that flows through the current detection unit may be used to represent a current that flows through the circuit breaker. The elements have very small sizes and may be integrated into the miniature circuit breaker. The current detection unit in this application has a simple structure and relatively low costs, and can achieve a relatively good detection accuracy.

In a possible design, the current detection unit further includes a printed circuit board (PCB) board, and the first voltage sampling point, the second voltage sampling point, and the signal output terminal are all disposed on the PCB board. The PCB board may implement electrical connections between the first voltage sampling point and the signal output terminal and between the second voltage sampling point and the signal output terminal, and may transfer the voltage difference between the first voltage sampling point and the second voltage sampling point to the outside of the circuit breaker body using the signal output terminal to facilitate calculation, based on the voltage difference, of a current that flows through the circuit breaker body.

In a possible design, the current detection unit further includes a first busbar and a second busbar, and the circuit breaker body includes a first power connecting terminal and a magnetic tripping element coil. One end of the PCB board is connected to the first busbar, and another end of the PCB board is connected to the second busbar to transfer a current from the first busbar to the second busbar. Another end of the first busbar is connected to the first power connecting terminal to transfer a current from the first power connecting terminal to the PCB board. Another end of the second busbar is connected to the magnetic tripping element coil, to transfer a current from the PCB board to the other end of the circuit breaker body using the magnetic tripping element coil. The first busbar and the second busbar are used to facilitate assembly between the current detection unit and the circuit breaker body. A first function of the PCB board is to implement an electrical connection between the first busbar and the second busbar, to implement through-current between the first busbar and the second busbar, to further implement, based on a connection relationship between the first busbar, the second busbar, and the circuit breaker body, through-current between the current detection unit and the circuit breaker body. A second function of the PCB board in the miniature circuit breaker is to implement electrical connections between the first voltage sampling point and the signal output terminal and between the second voltage sampling point and the signal output terminal.

In a possible design, the first busbar and the second busbar are disposed at intervals on the PCB board, the first voltage sampling point is close to the first busbar, and the second voltage sampling point is close to the second busbar. When a position of the first voltage sampling point on the PCB board is close to the first busbar, and a position of the second voltage sampling point on the PCB board is close to the second busbar, the voltage difference between the first voltage sampling point and the second voltage sampling point may reflect a voltage drop generated when a current flows through the PCB board. In addition, when there is a fixed interval between the first busbar and the second busbar on the PCB board, the voltage difference between the first voltage sampling point and the second voltage sampling point is sufficiently apparent, making it easy to detect the voltage drop generated when a current flows through the PCB board.

In a possible design, the current detection unit further includes a temperature detection element, and the temperature detection element is welded to the PCB board and is connected to the signal output terminal. The temperature detection element is configured to provide a temperature sampling value to the signal output terminal, where the temperature sampling value is a temperature that is of the PCB board and that is collected by the temperature detection element. The signal output terminal is further configured to output the temperature sampling value provided by the temperature detection element. Because a conductive material on the PCB board is usually copper, whose resistivity is easily affected by a temperature of the PCB board, in a working process of the circuit breaker, a current that flows through the PCB board generates a voltage drop. To improve accuracy of calculating a current that flows through the circuit breaker, the temperature detection element is added to the current detection unit in this application, and the temperature of the PCB board is detected using the temperature detection element, and then an amount of a current that flows through the current detection unit is calculated based on the temperature sampling value detected by the temperature detection element and the detected voltage difference sampling value, to more accurately represent an actual amount of a current that flows through the circuit breaker.

In a possible design, the circuit breaker is provided with a plastic isolation panel, and the plastic isolation panel isolates the circuit breaker body and the current detection unit into different cavities.

In a possible design, the circuit breaker body further includes a contact system, a bimetallic finger, and a second power connecting terminal. The magnetic tripping element coil is further connected to the contact system. The contact system is further connected to the bimetallic finger. The bimetallic finger is further connected to the second power connecting terminal. A current flowing into the magnetic tripping element coil flows into the second power connecting terminal after being transferred by the contact system and the bimetallic finger.

According to a second aspect, this application provides a circuit breaker control system, including a miniature circuit breaker configured to output a voltage difference sampling value and a temperature sampling value to a control device, where the voltage difference sampling value is a voltage difference between a first voltage sampling point and a second voltage sampling point of the current detection unit, and the temperature sampling value is a temperature collected by a temperature detection element of the current detection unit, and the control device configured to obtain the voltage difference sampling value and the temperature sampling value that are output by the miniature circuit breaker, and obtain, based on the voltage difference sampling value and the temperature sampling value, a current that flows through the miniature circuit breaker. In the control system including the control device and the miniature circuit breaker, the operation of calculating, by the control device based on the voltage difference sampling value and the temperature sampling value that are output by a signal output terminal of the circuit breaker, an amount of a current that flows through the circuit breaker may be performed by software, or may be performed by a control device connected to the circuit breaker. By calculating, based on the temperature sampling value detected by the temperature detection element and the voltage difference sampling value, the amount of the current that flows through the current detection unit, an actual amount of the current that flows through the circuit breaker may be more reliably represented.

In a possible design, the control device is further configured to start a high-temperature alarm when determining that the temperature sampling value is higher than a preset threshold.

According to a third aspect, this application provides a circuit breaker control method. The method includes obtaining, by a control device, a voltage difference sampling value and a temperature sampling value that are output by a signal output terminal of a circuit breaker, where the voltage difference sampling value is a voltage difference between a first voltage sampling point and a second voltage sampling point of the current detection unit, and the temperature sampling value is a temperature collected by a temperature detection element of the current detection unit, and obtaining, by the control device based on the voltage difference sampling value and the temperature sampling value, a current that flows through the miniature circuit breaker. The operation of calculating, by the control device based on the voltage difference sampling value and the temperature sampling value that are output by the signal output terminal of the circuit breaker, an amount of a current that flows through the circuit breaker may be performed by software, or may be performed by a control device connected to the circuit breaker. By calculating, based on the temperature sampling value detected by the temperature detection element and the voltage difference sampling value, the amount of the current that flows through the current detection unit, an actual amount of the current that flows through the circuit breaker may be more reliably represented.

In a possible design, the method further includes starting, by the control device, a high-temperature alarm when determining that the temperature sampling value is higher than a preset threshold.

According to a fourth aspect, this application provides a circuit breaker control apparatus, including an obtaining unit configured to obtain a voltage difference sampling value and a temperature sampling value that are output by a signal output terminal of a circuit breaker, where the voltage difference sampling value is a voltage difference between a first voltage sampling point and a second voltage sampling point of the current detection unit, and the temperature sampling value is a temperature collected by a temperature detection element of the current detection unit, and a processing unit configured to obtain, based on the voltage difference sampling value and the temperature sampling value, a current that flows through the miniature circuit breaker.

In a possible design, the processing unit is further configured to start a high-temperature alarm when determining that the temperature sampling value is higher than a preset threshold.

According to a fifth aspect, this application provides another miniature circuit breaker, including a circuit breaker body and a current detection unit, where the circuit breaker body and the current detection unit are located in respectively independent cavities in the circuit breaker and are electrically connected to each other, and after a current that flows from one end of the circuit breaker body flows through the current detection unit, the current flows into another end of the circuit breaker body, the current detection unit includes a voltage drop detection assembly and a signal output terminal, the voltage drop detection assembly includes a first voltage sampling point and a second voltage sampling point, where the first voltage sampling point and the second voltage sampling point are connected to the signal output terminal, and the signal output terminal is configured to output a voltage difference sampling value, where the voltage difference sampling value is a voltage difference between the first voltage sampling point and the second voltage sampling point. The current detection unit further includes a PCB board, and the first voltage sampling point, the second voltage sampling point, and the signal output terminal are all disposed on the PCB board. The current detection unit further includes a current divider, a first busbar, and a second busbar. The circuit breaker body includes a first power connecting terminal and a magnetic tripping element coil. A first end of the current divider is connected to the first busbar using the PCB board, and a second end of the current divider is connected to the second busbar using the PCB board to transfer a current from the first busbar to the second busbar. Another end of the first busbar is connected to the first power connecting terminal to transfer a current from the first power connecting terminal to the current divider. Another end of the second busbar is connected to the magnetic tripping element coil, to transfer a current from the current divider to the other end of the circuit breaker body using the magnetic tripping element coil.

In the current detection unit, the first busbar and the second busbar are used to facilitate assembly between the current detection unit and the circuit breaker body, the current divider is configured to implement through-current between the first busbar and the second busbar, to further implement, based on a connection relationship between the first busbar, the second busbar, and the circuit breaker body, through-current between the current detection unit and the circuit breaker body. The PCB board in the miniature circuit breaker is configured to implement electrical connections between the current divider and the first busbar and between the current divider and the second busbar, and implement electrical connections between the first voltage sampling point and the signal output terminal and between the second voltage sampling point and the signal output terminal.

In a possible design, the first voltage sampling point is disposed close to the first end of the current divider, and the second voltage sampling point is disposed close to the second end of the current divider. When the first voltage sampling point is disposed to close to the first end of the current divider, and the second voltage sampling point is disposed to close to the second end of the current divider, the voltage difference between the first voltage sampling point and the second voltage sampling point may reflect a voltage drop generated when a current flows through the current divider. In addition, because there is a fixed interval between the first end and the second end of the current divider, a fixed interval also exists between the first voltage sampling point and the second voltage sampling point due to such a connection relationship such that the voltage difference between the first voltage sampling point and the second voltage sampling point is sufficiently apparent, making it easy to detect a voltage drop generated when a current flows through the PCB board.

In a possible design, the first voltage sampling point is located in a first welding region between the current divider and the PCB board, and the second voltage sampling point is located in a second welding region between the current divider and the PCB board. The first welding region is close to the first busbar, and the second welding region is close to the second busbar. The first voltage sampling point and the second voltage sampling point are located in the welding regions between the two ends of the current divider and the PCB board, thereby facilitating detection of a voltage drop generated when a current flows through the current divider.

It is clearer and easier to understand these aspects or other aspects of this application in descriptions of the following embodiments.

DESCRIPTION OF EMBODIMENTS

The following describes the technical solutions in the embodiments of this application with reference to the accompanying drawings in the embodiments of this application. A specific operation method in method embodiments may also be applied to an apparatus embodiment or a system embodiment.

It should be noted that, "a plurality of" in the embodiments of the present disclosure means two or more. In view of this, "a plurality of" in the embodiments of the present disclosure may also be understood as "at least two". The term "and/or" describes an association relationship for describing associated objects and represents that three relationships may exist. For example, A and/or B may represent the following three cases Only A exists, both A and B exist, and only B exists. In addition, if there is no special description, the character "/" generally indicates an "or" relationship between the associated objects.

Figure 1:
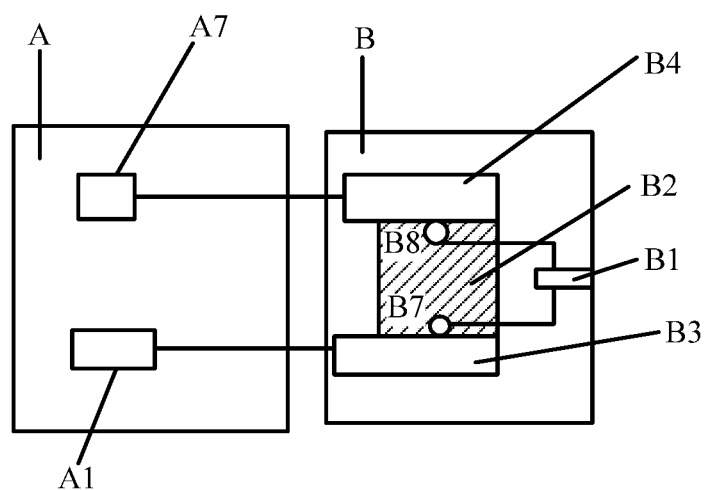
FIG. 1 is a schematic structural diagram of a miniature circuit breaker according to an embodiment of this application.

As shown in FIG. 1, a miniature circuit breaker provided in this application includes a circuit breaker body A and a current detection unit B. The circuit breaker body A and the current detection unit B are located in respectively independent cavities in the circuit breaker and are electrically connected to each other. After a current that flows from one end of the circuit breaker body A flows through the current detection unit B, the current flows into another end of the circuit breaker body A. The current detection unit B includes a voltage drop detection assembly B2 and a signal output terminal B1. The voltage drop detection assembly B2 includes a first voltage sampling point B7 and a second voltage sampling point B8. The first voltage sampling point B7 and the second voltage sampling point B8 are connected to the signal output terminal B1. The signal output terminal B1 is configured to output a voltage difference sampling value. The voltage difference sampling value is a voltage difference between the first voltage sampling point B7 and the second voltage sampling point B8.

The current detection unit B in this application includes the elements of the voltage drop detection assembly B2 and the signal output terminal B1. A connection relationship between the elements and a connection relationship between the elements and the circuit breaker body A enable the current detection unit B in this application to implement through-current with the circuit breaker body A, detect a voltage difference generated when the current detection unit is current-through, and output the voltage difference to the outside to calculate, based on the voltage difference, an amount of a current that flows through the current detection unit B. The current that flows through the current detection unit B may be used to represent a current that flows through the circuit breaker. The elements have very small sizes and may be integrated into the miniature circuit breaker. The current detection unit B in this application has a simple structure and relatively low costs, and can predict a relatively good detection accuracy. In addition, the current detection unit B and the circuit breaker body A (including an operating mechanism, an arc-extinguishing system, and the like) in this application are isolated from each other, and do not affect an electrical property of the circuit breaker.

In a possible design, the current detection unit B further includes a PCB board, and the first voltage sampling point B7, the second voltage sampling point B8, and the signal output terminal B1 are all disposed on the PCB board. The PCB board may implement electrical connections between the first voltage sampling point B7 and the signal output terminal B1 and between the second voltage sampling point B8 and the signal output terminal B1, and may transfer the voltage difference between the first voltage sampling point B7 and the second voltage sampling point B8 to the outside of the circuit breaker body A using the signal output terminal B1 to facilitate calculation, based on the voltage difference, of a voltage that flows through the circuit breaker body A.

In a first implementation scenario, the current detection unit B provided in this application further includes a first busbar B3 and a second busbar B4, and the circuit breaker body A includes a first power connecting terminal A1, a magnetic tripping element coil A7, and the like.

Further, an electrical connection relationship between the current detection unit B and the circuit breaker body A provided in this application is as follows. One end of the first busbar B3 is connected to the first power connecting terminal A1 of the circuit breaker body A, and another end of the first busbar B3 is connected to one end of the PCB board, to transfer a current from the first power connecting terminal A1 to the PCB board. One end of the second busbar B4 is connected to the magnetic tripping element coil A7, and another end of the second busbar B4 is connected to the PCB board to transfer a current from the PCB board to the other end of the circuit breaker body A using the magnetic tripping element coil A7. The PCB board is configured to transfer a current from the first busbar B3 to the second busbar B4. The first busbar B3 and the second busbar B4 are used to facilitate assembly between the current detection unit and the circuit breaker body. The PCB board not only can implement electrical connections between the first voltage sampling point B7 and the signal output terminal B1 and between the second voltage sampling point B8 and the signal output terminal B1, but also can be used as a current-through apparatus between the first busbar B3 and the second busbar B4 to transfer a current from the first busbar B3 to the second busbar B4. A reason of using the PCB board as a current-through apparatus between the first busbar B3 and the second busbar B4 is that the PCB board has an advantage of relatively low costs and relatively low heat.

The first busbar B3 and the second busbar B4 may be welded to the PCB board.

In a possible design, the first busbar B3 and the second busbar B4 are disposed at intervals on the PCB board, the first voltage sampling point B7 on the PCB board is close to the first busbar B3, and the second voltage sampling point B8 on the PCB board is close to the second busbar B4. In this way, the voltage difference between the first voltage sampling point B7 and the second voltage sampling point B8 can be sufficiently apparent, making it easy to detect a voltage drop generated when a current flows through the PCB board.

In an optional example, materials of the first busbar B3 and the second busbar B4 are copper. A conductive material on the PCB board is pure copper foil.

In the first implementation scenario, this application further provides a current detection unit having a temperature detection element. Further, in addition to a PCB board, a first voltage sampling point B7, a second voltage sampling point B8, a signal output terminal B1, a first busbar B3, and a second busbar B4, the current detection unit B further includes a temperature detection element. The temperature detection element is welded to the PCB board and is connected to the signal output terminal B1. The temperature detection element is configured to provide a temperature sampling value to the signal output terminal B1. The temperature sampling value is a temperature that is of the PCB board and that is collected by the temperature detection element. The signal output terminal B1 is further configured to output the temperature sampling value provided by the temperature detection element.

Because a conductive material on the PCB board is usually copper, whose resistivity is easily affected by a temperature of the PCB board, in a working process of the circuit breaker, a current that flows through the PCB board generates a voltage drop. To improve accuracy of a current that flows through the circuit breaker, the temperature detection element is added to the current detection unit B in this application, and the temperature of the PCB board is detected using the temperature detection element, and then an amount of a current that flows through the current detection unit B is calculated based on the detected voltage difference sampling value and temperature sampling value to more accurately represent an actual amount of a current that flows through the circuit breaker.

Figure 2:
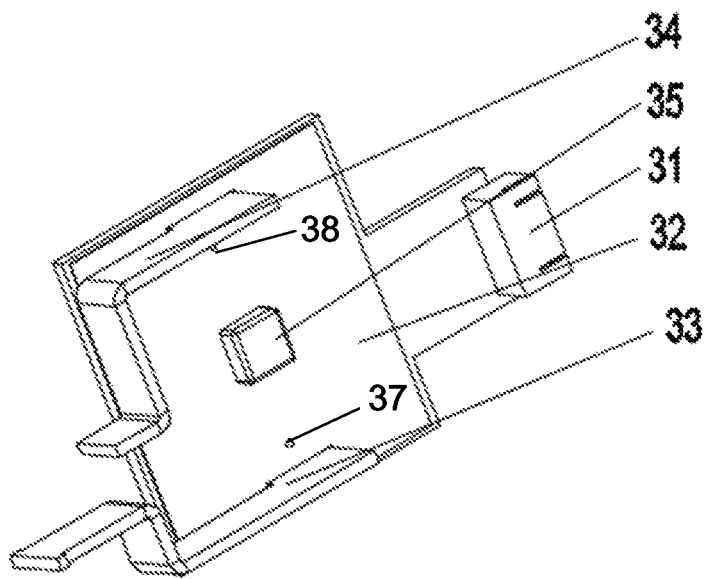
FIG. 2 is a schematic structural diagram of a current detection unit according to an embodiment of this application.

In an optional example, in the foregoing current detection unit having a temperature detection element, the temperature detection element may be a temperature sensor, for example, a temperature sensor 35 in FIG. 2.

In a second implementation scenario, this application provides a current detection unit B having a current divider. Further, in addition to a PCB board, a first voltage sampling point B7, a second voltage sampling point B8, a signal output terminal B1, a first busbar B3, and a second busbar B4, the current detection unit B further includes a current divider. Compared with the current detection unit provided in the first implementation scenario, a same point lies in that the first voltage sampling point B7, the second voltage sampling point B8, and the signal output terminal B1 are all disposed on the PCB board. The PCB board may implement electrical connections between the first voltage sampling point B7 and the signal output terminal B1 and between the second voltage sampling point B8 and the signal output terminal B1, and may transfer the voltage difference between the first voltage sampling point B7 and the second voltage sampling point B8 to the outside of the circuit breaker body using the signal output terminal B1 to facilitate calculation, based on the voltage difference, of a voltage that flows through the circuit breaker body A.

Compared with the current detection unit B provided in the first implementation scenario, a difference lies in that the PCB board in this design is not used as a current-through apparatus between the first busbar B3 and the second busbar B4, but the current divider is used as the current-through apparatus between the first busbar B3 and the second busbar B4. The PCB board in this implementation scenario is mainly used to implement electrical connections between the current divider and the first busbar B3 and between the current divider and the second busbar B4, and implement electrical connections between the first voltage sampling point B7 and the signal output terminal B1 and between the second voltage sampling point B8 and the signal output terminal B1.

Another difference lies in that a conductive material on the current divider is not copper foil whose resistivity is easily affected by a temperature, but a conductive material whose resistivity is not easily affected by a temperature, such as manganin alloy or constantan alloy. Resistivity of such type of alloy changes slightly with a temperature in a specific temperature range, and therefore for the current detection unit having a current divider, a temperature detection element does not need to be added to detect a temperature of the PCB board, and an amount of a current that flows through the circuit breaker does not need to be calculated through temperature correction.

Further, an electrical connection relationship between the current detection unit B having a current divider and the circuit breaker body A provided in this application is as follows.

A first end of the current divider is connected to the first busbar B3 using the PCB board, and a second end of the current divider is connected to the second busbar B4 using the PCB board, to transfer a current from the first busbar B3 to the second busbar B4. Another end of the first busbar B3 is connected to the first power connecting terminal A1 to transfer a current from the first power connecting terminal A1 to the current divider. Another end of the second busbar B4 is connected to the magnetic tripping element coil A7 to transfer a current from the current divider to another end of the circuit breaker body A using the magnetic tripping element coil A7.

The first busbar B3 and the second busbar B4 are used to facilitate assembly between the current detection unit and the circuit breaker body, the current divider is configured to implement through-current between the first busbar B3 and the second busbar B4 to further implement, based on a connection relationship between the first busbar B3, the second busbar B4, and the circuit breaker body A, through-current between the current detection unit B and the circuit breaker body A. The PCB board in the miniature circuit breaker is configured to implement electrical connections between the current divider and the first busbar B3 and between the current divider and the second busbar B4, and implement electrical connections between the first voltage sampling point B7 and the signal output terminal B1 and between the second voltage sampling point B8 and the signal output terminal B1.

In an optional example, a shape of the current divider is a C shape or is another shape. When a distance between the current divider and the signal output terminal B1 is relatively large, it is inconvenient to directly weld the current divider to the signal output terminal B1. In addition, shapes of connection end portions of the current divider, the first busbar B3, and the second busbar B4 are different, making it difficult to directly weld the current divider, the first busbar B3, and the second busbar B4 together. Therefore, for ease of assembly, the first busbar, the second busbar, and the current divider are all welded to the PCB board, and the current divider may implement electrical connections to the first busbar B3 and to the second busbar B4 using an internal line of the PCB board.

In the design in which the current detection unit has a current divider, the first voltage sampling point B7 and the second voltage sampling point B8 can be located on the PCB board in a plurality of implementations. In general, the first voltage sampling point B7 is disposed close to the first end of the current divider, and the first end of the current divider is electrically connected to the first busbar B3 using the PCB board, and the second voltage sampling point B8 is disposed close to the second end of the current divider, and the second end of the current divider is electrically connected to the second busbar B4 using the PCB board. When the first voltage sampling point is disposed close to the first end of the current divider, and the second voltage sampling point is disposed close to the second end of the current divider, the voltage difference between the first voltage sampling point and the second voltage sampling point may reflect a voltage drop generated when a current flows through the current divider.

Optionally, the first voltage sampling point B7 may be connected to one end of the current divider, and the second voltage sampling point B8 may be connected to another end of the current divider. Because the current divider is used as a current-through apparatus, such a connection relationship enables the voltage difference between the first voltage sampling point B7 and the second voltage sampling point B8 to reflect a voltage drop generated when a current flows through the current divider, and may further facilitate detection of the voltage difference between the first voltage sampling point B7 and the second voltage sampling point B8.

In an example, the first voltage sampling point B7 is located in a first welding region between the current divider and the PCB board (where the first voltage sampling point B7 is located in a welding position between the current divider and the PCB board, and the first voltage sampling point B7 may be considered as being located on both the PCB board and the current divider), and the second voltage sampling point B8 is located in a second welding region between the current divider and the PCB board (where the second voltage sampling point B8 is located in a welding position between the current divider and the PCB board, and the second voltage sampling point B8 may be considered as being located on both the PCB board and the current divider). The first welding region is close to the first busbar, and the second welding region is close to the second busbar. Because there is a fixed interval between the first end and the second end of the current divider, there is also a fixed interval between the first voltage sampling point and the second voltage sampling point due to such a connection relationship, making the voltage difference between the first voltage sampling point and the second voltage sampling point sufficiently apparent, and therefore it is easy to detect a voltage drop generated when a current flows through the PCB board.

Optionally, the first voltage sampling point B7 and the second voltage sampling point B8 may not be directly connected to the current divider. In an example, the first voltage sampling point B7 may be located in a first region on the PCB board, where the first region is disposed close to the first busbar B3 and the first end of the current divider, and the second voltage sampling point B8 may be located in a second region on the PCB board, where the second region is disposed close to the second busbar B4 and the second end of the current divider.

In any possible design of the current detection unit provided in the foregoing two implementation scenarios, to enable the circuit breaker body A and the current detection unit B to be located in respectively independent cavities in the circuit breaker, a plastic isolation panel is disposed in the circuit breaker. The plastic isolation panel isolates the circuit breaker body A and the current detection unit B into different cavities.

In any possible design of the current detection unit provided in the foregoing two implementation scenarios, in addition to the first power connecting terminal A1 and the magnetic tripping element coil A7, the circuit breaker body A further includes an element such as a contact system, a bimetallic finger, and a second power connecting terminal. The magnetic tripping element coil A7 is further connected to the contact system. The contact system is further connected to the bimetallic finger. The bimetallic finger is further connected to the second power connecting terminal. In this way, a current that flows into the magnetic tripping element coil A7 flows into the second power connecting terminal after being transferred by the contact system and the bimetallic finger.

Based on the foregoing embodiment, an embodiment of this application provides a miniature circuit breaker. The miniature circuit breaker includes a circuit breaker body A and a current detection unit B, and the circuit breaker body A and the current detection unit B are located in respectively independent cavities in the circuit breaker and are electrically connected to each other. A voltage drop detection assembly of the current detection unit B has low heat, is isolated from a circuit breaker mechanism and an arc-extinguishing system, and does not affect an electrical property of the circuit breaker.

As shown in FIG. 2, a structure of the current detection unit B includes a PCB board 32, a signal output terminal 31, a first busbar 33, a second busbar 34, and a temperature sensor 35. The signal output terminal 31, the first busbar 33, the second busbar 34, and the temperature sensor 35 are all fixed onto the PCB board 32 through welding. Therefore, the PCB board 32 is used as a current-through apparatus of the current detection unit, and a current that is provided by the first busbar 33 may be directed into the second busbar 34. The PCB board 32 further includes a first voltage sampling point 37 and a second voltage sampling point 38, and the first voltage sampling point 37 and the second voltage sampling point 38 are electrically connected to the signal output terminal 31 using a line on the PCB board, and therefore the PCB board 32 may also be used as a voltage drop detection assembly of the current detection unit, and may transfer a voltage difference between the first voltage sampling point 37 and the second voltage sampling point 38 on the PCB board 32 to the signal output terminal 31 to output the voltage difference. The first voltage sampling point 37 is close to the first busbar 33, and the second voltage sampling point 38 is close to the second busbar 34.

The first busbar 33 and the second busbar 34 may be copper bars, and shapes of the first busbar 33 and the second busbar 34 are not limited to long-strip shapes shown in FIG. 2, but may be other shapes.

In the current detection unit shown in FIG. 2, one end of the PCB board 32 is connected to one end of the first busbar 33, and another end of the PCB board 32 is connected to one end of the second busbar 34, a current that flows into the first busbar 33 may be transferred into the PCB board 32, and a current that flows into the PCB board 32 may be transferred into the second busbar 34. Alternatively, on the contrary, a current that flows into the second busbar 34 may be transferred into the PCB board 32, and a current that flows into the PCB board 32 may be transferred into the first busbar 33.

In the current detection unit shown in FIG. 2, the PCB board 32 includes the first voltage sampling point 37 and the second voltage sampling point 38. Both the first voltage sampling point 37 and the second voltage sampling point 38 are located on the PCB board 32, the first voltage sampling point 37 is disposed close to the first busbar 33, and the second voltage sampling point 38 is disposed close to the second busbar 34, and the first voltage sampling point 37 and the second voltage sampling point 38 are each electrically connected to the signal output terminal 31 using a signal transmission line on the PCB board 32 such that the signal output terminal 31 outputs the voltage difference between the first voltage sampling point 37 and the second voltage sampling point 38.

There is pure copper foil disposed on the PCB board, to satisfy current transferring. Because resistivity of the copper foil changes with a temperature, a voltage drop is generated when a current flows through the PCB board 32. There is a specific function relationship between the voltage drop, the temperature of the PCB board 32, and the current that flows through the PCB board 32, and the function relationship is as follows:

$$K = \beta_0 \frac{L}{S} = \frac{V}{I(1+\alpha T)},$$

where K is a resistance when the PCB copper foil is at 0° C., $\beta_0$ is resistivity when the copper foil is at 0 degrees Celsius (° C.), S is a cross sectional area of the copper foil, and L is a length of the copper foil. When the cross sectional area and the length of the copper foil are specified, K is a fixed value. $\alpha$ is a resistance temperature coefficient of the copper foil, V is a voltage drop between two voltage sampling points of the PCB board 32, I is an actual current that flows through the PCB board 32, and T is a surface temperature that is of the PCB board 32 and that is detected by the temperature sensor 35. When I remains unchanged, V changes with T.

Optionally, in the current detection unit shown in FIG. 2, to detect more accurately the current that flows through the PCB board 32, in addition to a generated voltage drop, a surface temperature of the PCB board 32 further needs to be detected to calculate, based on the surface temperature of the PCB board 32 and the generated voltage drop, the current that flows through the PCB board 32.

Optionally, in the current detection unit shown in FIG. 2, the temperature sensor 35 on the PCB board 32 is connected to the signal output terminal 31. Further, the temperature sensor 35 may be electrically connected to the signal output terminal 31 using a signal transmission line on the PCB board 32, for example, a differential pair. The temperature sensor 35 is mainly configured to collect a temperature sampling value in a region in which the PCB board 32 is located, and provides the temperature sampling value to the signal output terminal 31. The signal output terminal 31 outputs the temperature sampling value provided by the temperature sensor 35.

The voltage difference sampling value and the temperature sampling value that are output by the signal output terminal 31 may be used to calculate an amount of a current that flows through the PCB board 32, and the amount of the current that flows through the PCB board 32 may represent an amount of a current that flows through the circuit breaker. It should be noted that, the operation of calculating, based on the voltage difference sampling value and the temperature sampling value that are output by the signal output terminal 31, the amount of the current that flows through the circuit breaker may be performed by software, that is, may be performed using a computer application (software), or may be performed by a control device that is connected to the circuit breaker.

Based on the foregoing formula, this application may effectively ensure consistency between resistances of voltage sampling points by accurately controlling the cross sectional area of the pure copper foil on the PCB board 32 to obtain a fixed K value. Based on the fixed K value, the amount of the current that flows through the PCB board may be calculated by substituting, into the formula, the temperature sampling value and the voltage difference sampling value that are output by the signal output terminal 31.

It should be noted that, in a working process of the circuit breaker, the voltage drop V between the first voltage sampling point 37 and the second voltage sampling point 38 on the PCB board 32 may change, and the surface temperature of the PCB board 32 may also change. Based on a function relationship in which the voltage difference changes with a temperature and a current, a current that flows through the miniature circuit breaker may be calculated based on the voltage difference sampling value and the temperature sampling value that are output by the signal output terminal of the current detection unit:

$$K = \frac{V_1}{I_1(1+\alpha T_1)} = \frac{V_2}{I_2(1+\alpha T_2)}.$$

When the temperature sampling value output by the signal output terminal 31 is $T_1$, and the voltage difference sampling value is $V_1$, a current $I_1$ that flows through the circuit breaker may be calculated based on the foregoing formula. When the temperature sampling value output by the signal output terminal 31 is $T_2$, and the voltage difference sampling value is $V_2$, a current $I_2$ that flows through the circuit breaker may be calculated based on the foregoing formula.

The circuit breaker body in this application includes a structure of a conventional miniature pyromagnetic circuit breaker, and the circuit breaker in this application is a miniature circuit breaker that has a current detection function and that is obtained by adding the current detection unit shown in FIG. 2 to the structure of the conventional miniature pyromagnetic circuit breaker.

Figure 3:
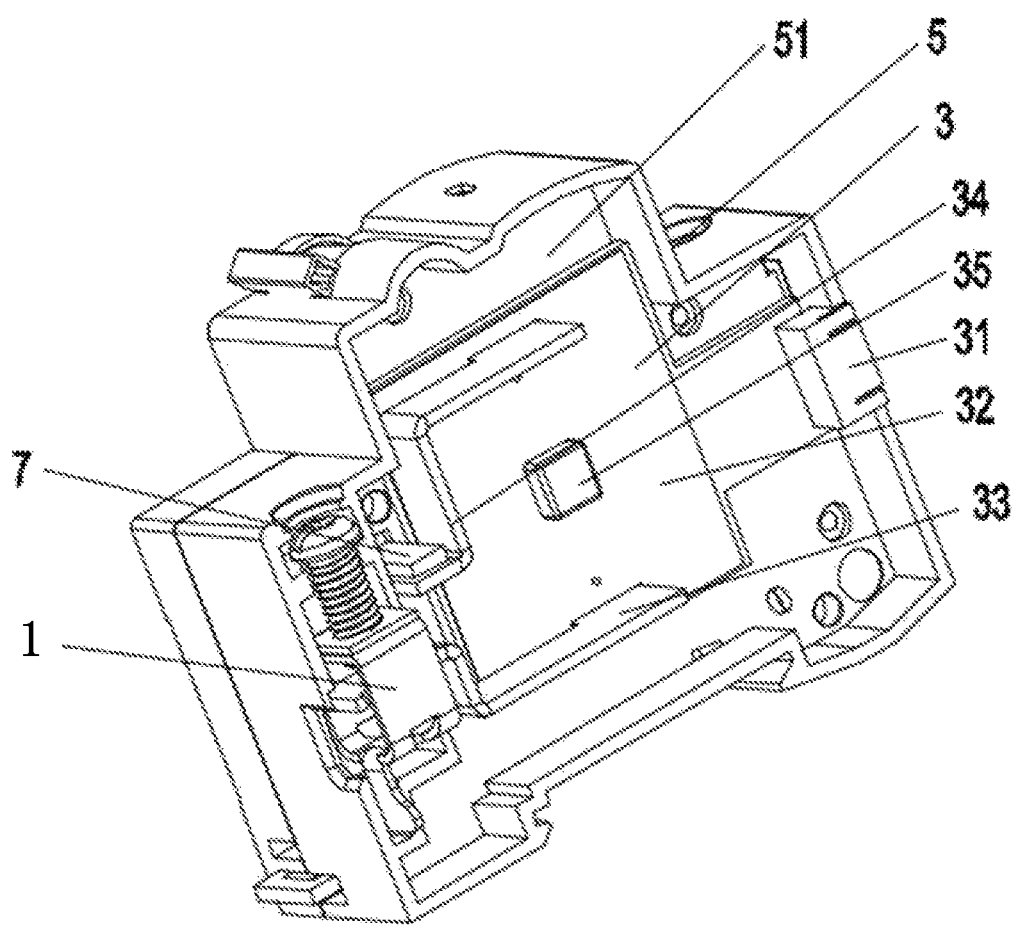
FIG. 3 is a schematic structural diagram of a side of a current detection unit of a miniature circuit breaker according to an embodiment of this application.
Figure 4:
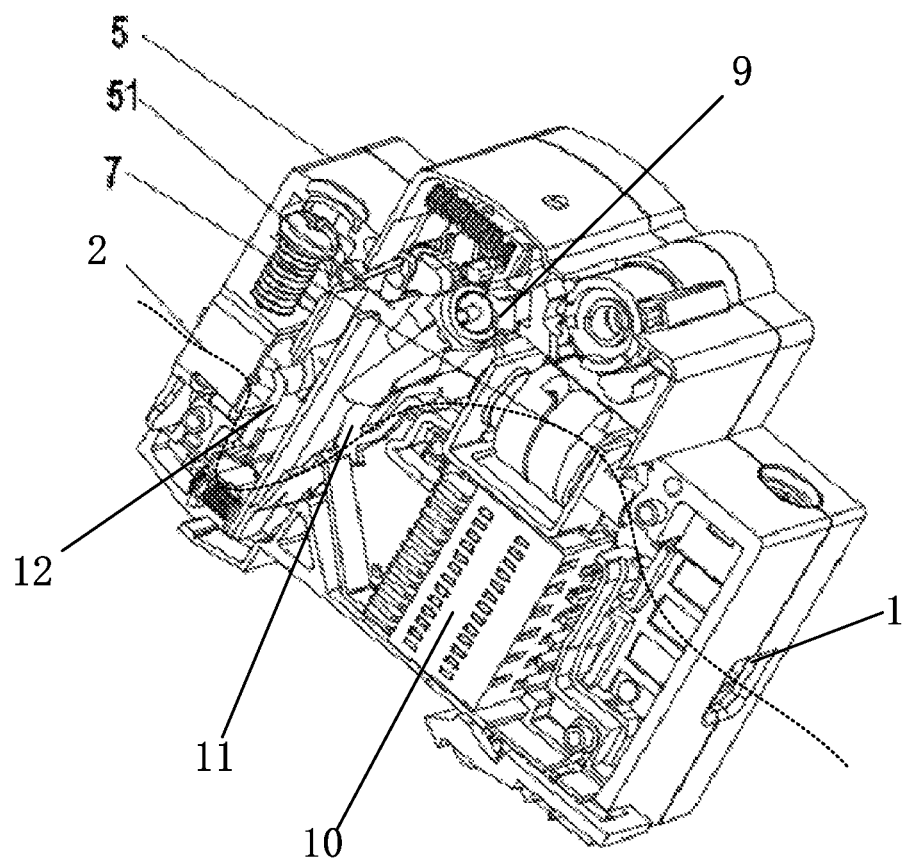
FIG. 4 is a schematic structural diagram of a side of a circuit breaker body of a miniature circuit breaker according to an embodiment of this application.
Figure 6:
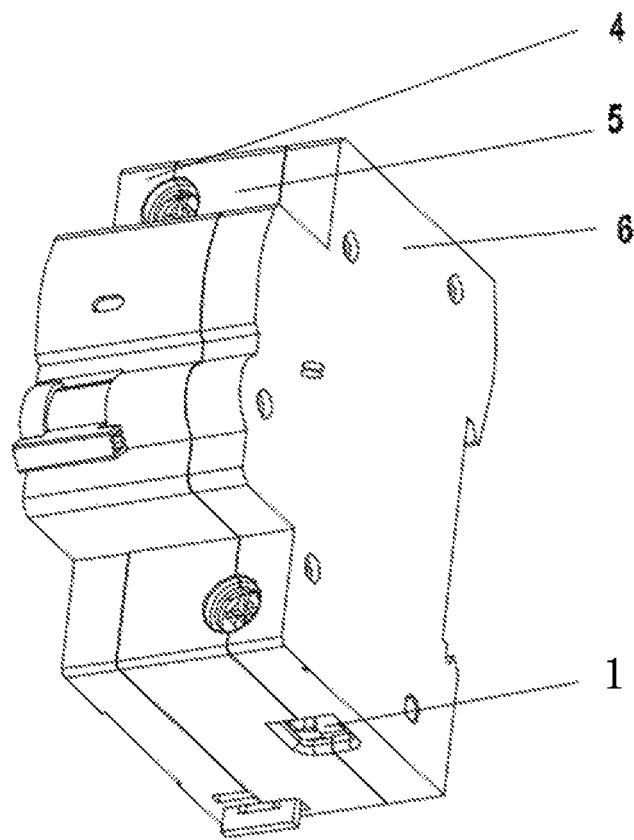
FIG. 6 is a schematic diagram of an appearance of a miniature circuit breaker according to an embodiment of this application.

An internal structure of the miniature circuit breaker that has a current detection function is shown in FIG. 3 and FIG. 4. FIG. 3 is an internal view of a right side of the circuit breaker (where a case 6 as shown in FIG. 6 is hidden), including a current detection unit 3 of the circuit breaker. The current detection unit 3 includes a signal output terminal 31, a PCB board 32, a first busbar 33, a second busbar 34, and a temperature sensor 35. FIG. 4 is an internal view of a left side of the circuit breaker (where a case 4 as shown in FIG. 6 is hidden). The circuit breaker body includes parts such as a circuit breaker operating mechanism 9, an arc-extinguishing chamber 10, a contact system 11, a bimetallic finger 12 (a thermal tripping element), and a magnetic tripping element coil 7.

Figure 5:
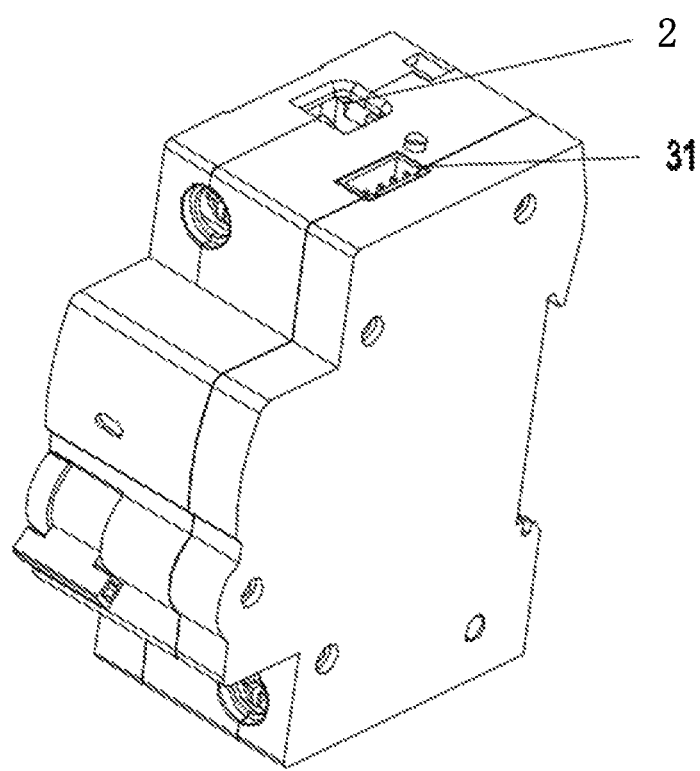
FIG. 5 is a schematic diagram of an appearance of a miniature circuit breaker according to an embodiment of this application.

An appearance of the miniature circuit breaker that has a current detection function and that is provided in this application is shown in FIG. 5 and FIG. 6, and the appearance of the circuit breaker is similar to that of the conventional miniature pyromagnetic circuit breaker, a width is slightly increased, and the circuit breaker is mounted using a rail. A conventional circuit breaker body includes a second power connecting terminal 2 (the second power connecting terminal in the foregoing embodiment) and a first power connecting terminal 1 (the first power connecting terminal in the foregoing embodiment). In an aspect of an entire appearance of the miniature circuit breaker provided in this application, in addition to the second power connecting terminal 2 and the first power connecting terminal 1, a signal output terminal 31 is further included. As shown in FIG. 5, the second power connecting terminal 2 and the signal output terminal 31 are located on a same side. As shown in FIG. 6, the first power connecting terminal 1 is on an opposite side of the signal output terminal 31. As shown in FIG. 6, a housing of the circuit breaker includes three parts, a case 4, a case 5, and a case 6.

In order that a current that flows from one end of the circuit breaker body flows into another end of the circuit breaker body after flowing through the current detection unit, as shown in FIG. 3, a connection relationship between the current detection unit and the circuit breaker body is further as follows.

As shown in FIG. 4, one end of the first busbar 33 is welded to the first power connecting terminal 1 of the circuit breaker body, and another end of the first busbar 33 is welded to the PCB board 32, one end of the second busbar 34 is welded to the PCB board 32, and another end of the second busbar 34 is welded to the magnetic tripping element coil 7 of the circuit breaker body, and the magnetic tripping element coil 7 is further connected to the contact system 11, the contact system 11 is further connected to the bimetallic finger 12, and the bimetallic finger 12 is further connected to the second power connecting terminal 2.

In this way, a flowing direction of a current may be as follows. The current enters the PCB board 32 through the first busbar 33 that is connected to the first power connecting terminal 1. After the current flows through the PCB board 32, the current enters the second busbar 34. After the current enters the magnetic tripping element coil 7 through the second busbar 34, and after the current flows through transferring paths of the contact system 11 and the bimetallic finger 12, the current finally flows out of the second power connecting terminal 2. Certainly, the current path may be of an inverse direction of such an optional path.

In order that the circuit breaker body and the current detection unit are located in respectively independent cavities in the circuit breaker, as shown in FIG. 4, the circuit breaker is provided with a plastic isolation panel 51. The plastic isolation panel 51 isolates the circuit breaker body and the current detection unit into different cavities. A current detection part in FIG. 3 is isolated from parts in FIG. 4 such as the circuit breaker operating mechanism and the arc-extinguishing chamber by the middle plastic isolation panel 51 of the case 5.

The miniature circuit breaker provided in this application has all functions of a present conventional miniature circuit breaker. In addition, the signal output terminal 31 can output a voltage difference signal that is provided by the PCB board 32 integrated in the circuit breaker, and a temperature sampling signal provided by the temperature sensor 35. In this way, a control system of the circuit breaker may calculate, using a signal output by the signal output terminal 31 of the circuit breaker, an amount of a current that flows through the circuit breaker.

In addition, when the circuit breaker is in a fault state, and an internal temperature exceeds a specific threshold, an alarm signal may be output using the control system to prevent the circuit breaker from a serious accident such as firing.

In the foregoing embodiment, the current detection unit that can be integrated in the PCB board and that detects a voltage drop is added to the miniature circuit breaker, to implement through-current with the circuit breaker body, detect a voltage difference generated when the current detection unit is current-through, and output the voltage difference to the outside in order to calculate, based on the voltage difference, an amount of a current that flows through the circuit breaker. Because the current detection unit is an assembly integrated on the PCB board and has a very small size, a current detection function is integrated in the miniature circuit breaker. The current detection unit of the miniature circuit breaker in this application has a simple structure, relatively low costs, and a relatively good detection accuracy. In addition, the current detection unit has low heat and is isolated from a circuit breaker mechanism and an arc-extinguishing system, and therefore an electrical property of the circuit breaker is not affected. In the miniature circuit breaker provided in this embodiment of this application, because the temperature sensor is built in and can be used to detect an internal temperature of the circuit breaker in real time, the circuit breaker can be effectively prevented from firing.

Figure 7:
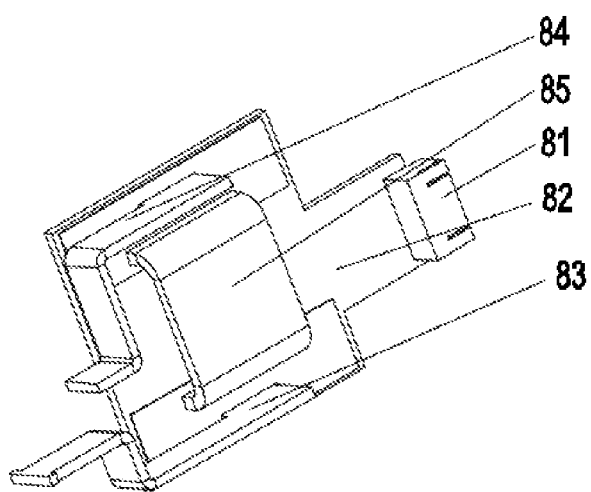
FIG. 7 is a schematic structural diagram of another current detection unit according to an embodiment of this application.

Based on the foregoing embodiments, this application further provides another miniature circuit breaker, and a structure of a current detection unit of the miniature circuit breaker is shown in FIG. 7. A difference between this embodiment and the foregoing embodiments lies in only that, the structure of the current detection unit of the miniature circuit breaker is different from that in the foregoing embodiments. Further, the current detection unit includes a PCB board 82 and a busbar 83, a busbar 84, a signal output terminal 81, and a current divider 85 that are welded to the PCB board. A connection relationship between the busbar 83, the busbar 84, and the circuit breaker body is the same as the connection relationship between the first busbar 33, the second busbar 34, and the circuit breaker body in the foregoing embodiments. This is not described herein again.

A first voltage sampling point and a second voltage sampling point are disposed at two ends of the current divider 85, the first voltage sampling point on the current divider 85 is located on an end portion that is of the current divider and that is connected to the busbar 83, and the second voltage sampling point on the current divider 85 is located on an end portion that is of the current divider 85 and that is connected to the busbar 84.

A shape of the current divider 85 is a C shape, one end of the current divider 85 is connected to the busbar 83, and another end is connected to the busbar 84. The two ends of the current divider 85, the busbar 83, the busbar 84, and the signal output terminal 81 are all welded to the PCB board 82. The PCB board 82 herein may implement electrical connections between the current divider 85 and the busbar 83 and between the current divider 85 and the busbar 84, and an electrical connection between the current divider 85 and the signal output terminal 81.

The signal output terminal 81 is configured to output a voltage difference sampling value. The voltage difference sampling value is a voltage difference between the first voltage sampling point and the second voltage sampling point.

A material of the current divider 85 is usually manganin alloy or constantan alloy. Resistivity of such type of alloy changes relatively slightly with a temperature in a specific temperature range, and an amount of a current can be accurately calculated without temperature correction compensation. Therefore, the voltage difference that is output by the signal output terminal 81 can be directly used to calculate an amount of a current that flows through the circuit breaker.

In the foregoing embodiment, the current detection unit that can be integrated in the PCB board and that detects a voltage drop is added to the miniature circuit breaker, to implement through-current with the circuit breaker body, detect a voltage difference generated when the current detection unit is current-through, and output the voltage difference to the outside in order to calculate, based on the voltage difference, an amount of a current that flows through the circuit breaker. Because the current detection unit is an assembly integrated on the PCB board and has a very small size, a current detection function is integrated in the miniature circuit breaker. The current detection unit of the miniature circuit breaker in this application has a simple structure, relatively low costs, and a relatively good detection accuracy. In addition, the current detection unit is isolated from a circuit breaker mechanism and an arc-extinguishing system, and therefore an electrical property of the circuit breaker is not affected.

According to the foregoing two types of miniature circuit breakers provided in the embodiments of this application, a current detection assembly that has a simple structure, a small volume, a detection element having low heat, and relatively low costs can be integrated into the miniature circuit breaker such that a current detection function is integrated in the miniature circuit breaker, and may be widely applied to a power distribution system in which an amount of a current that flows through the miniature circuit breaker needs to be detected, thereby reducing the costs and complexity of the power distribution system.

In this application, the operation of calculating, based on the voltage difference sampling value and the temperature sampling value that are output by the signal output terminal 31 of the miniature circuit breaker, an amount of a current that flows through the circuit breaker may be performed by the control device. Based on the same disclosure concept, this application further provides a circuit breaker control method. The method includes obtaining, by a control device, a voltage difference sampling value and a temperature sampling value that are output by a signal output terminal of a circuit breaker, where the voltage difference sampling value is a voltage difference between a first voltage sampling point and a second voltage sampling point of the current detection unit, and the temperature sampling value is a temperature collected by a temperature detection element of the current detection unit, and calculating, by the control device based on the voltage difference sampling value and the temperature sampling value, a current that flows through the miniature circuit breaker.

The circuit breaker is the circuit breaker that has a current detection function shown in FIG. 2 to FIG. 6 and that is provided in the embodiments of this application. The control device obtains the voltage difference sampling value and the temperature sampling value using the signal output terminal 31 of the circuit breaker. For specific content in which the current detection unit of the circuit breaker provides the voltage difference sampling value and the temperature sampling value to the signal output terminal 31, refer to the foregoing embodiments. This is not described herein again.

Optionally, the method further includes starting, by the control device, a high-temperature alarm when determining that the temperature sampling value is higher than a preset threshold.

Figure 8:
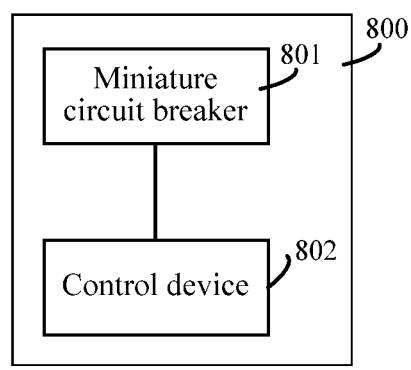
FIG. 8 is a schematic structural diagram of a circuit breaker control system according to an embodiment of this application.

Based on the same disclosure concept, as shown in FIG. 8, this application further provides a circuit breaker control system 800, including a miniature circuit breaker 801 configured to output a voltage difference sampling value and a temperature sampling value to a control device 802, where the voltage difference sampling value is a voltage difference between a first voltage sampling point and a second voltage sampling point of the current detection unit, and the temperature sampling value is a temperature collected by a temperature detection element of the current detection unit, and the control device 802 configured to obtain the voltage difference sampling value and the temperature sampling value that are output by the miniature circuit breaker 801, and obtain, based on the voltage difference sampling value and the temperature sampling value, a current that flows through the miniature circuit breaker.

The miniature circuit breaker 801 is a circuit breaker that has a current detection function shown in FIG. 2 to FIG. 6 and that is provided in the embodiments of this application, and the miniature circuit breaker 801 outputs the voltage difference sampling value and the temperature sampling value using the signal output terminal 31 to the control device 802. For specific content in which the current detection unit of the miniature circuit breaker 801 provides the voltage difference sampling value and the temperature sampling value to the signal output terminal 31, refer to the foregoing embodiments. This is not described herein again.

Optionally, the control device 802 is further configured to start a high-temperature alarm when determining that the temperature sampling value is higher than a preset threshold to effectively prevent the circuit breaker from firing.

It should be noted that, in this embodiment of this application, in addition to the control device, the operation of calculating, based on the voltage difference sampling value and the temperature sampling value that are output by the signal output terminal 31 of the miniature circuit breaker, an amount of a current that flows through the circuit breaker may alternatively be implemented by executing program code.

Figure 9:
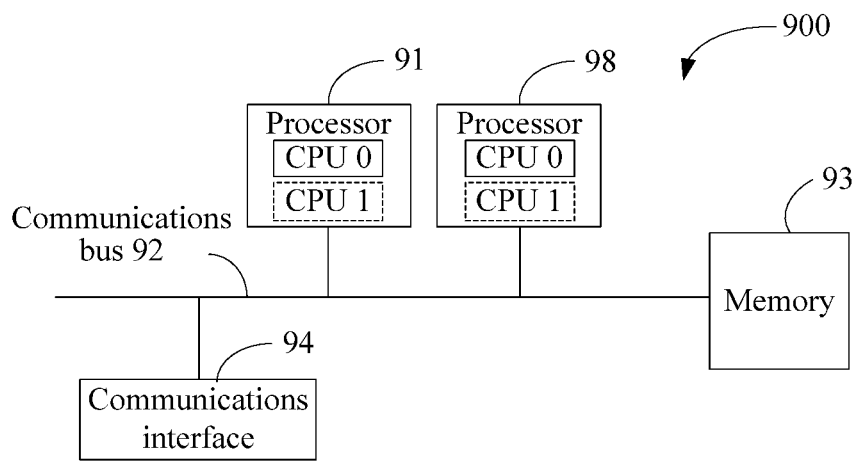
FIG. 9 is a schematic structural diagram of an apparatus according to an embodiment of this application.

Based on the same disclosure concept, FIG. 9 shows an apparatus 900 according to an embodiment of this application. The apparatus 900 includes at least one processor 91, a communications bus 92, a memory 93, and at least one communications interface 94. The apparatus 900 may be located out of a miniature circuit breaker, and is electrically connected to a signal output terminal of the miniature circuit breaker using the communications interface 94. The apparatus 900 may be a communications apparatus similar to a control device, or may be an apparatus executing program code.

The communications interface 94 is configured to obtain a voltage difference sampling value and a temperature sampling value that are output by the signal output terminal. The voltage difference sampling value is a voltage difference between a first voltage sampling point and a second voltage sampling point of the current detection unit, and the temperature sampling value is a temperature collected by a temperature detection element of the current detection unit.

The processor 91 is configured to calculate, based on the voltage difference sampling value and the temperature sampling value, a current that flows through the miniature circuit breaker.

The miniature circuit breaker is the miniature circuit breaker that has a current detection function shown in FIG. 2 to FIG. 6 and that is provided in the embodiments of this application, and the communications interface 94 obtains the voltage difference sampling value and the temperature sampling value using the signal output terminal 31 of the circuit breaker. For specific content in which the signal output terminal 31 of the circuit breaker provides the voltage difference sampling value and the temperature sampling value, refer to the foregoing embodiments. This is not described herein again.

Optionally, the processor 91 is further configured to start a high-temperature alarm when determining that the temperature sampling value is higher than a preset threshold.

The processor 91 may be a general central processing unit (CPU), a microprocessor, an application-specific integrated circuit (ASIC), or one or more integrated circuits configured to control execution of a program in the solutions of this application.

The communications bus 92 may include a path for transferring information between the foregoing components. The communications interface 94 may be implemented using any apparatus such as a transceiver, and is configured to communicate with another device or a communications network such as an Ethernet, a radio access network (RAN), or a wireless local area network (WLAN).

The memory 93 may be a read-only memory (ROM) or another type of static storage device that can store static information and a static instruction, or a random access memory (RAM) or another type of dynamic storage device that can store information and an instruction, or may be an electrically erasable programmable ROM (EEPROM), a compact disc ROM (CD-ROM) or another compact disc storage medium, optical disc storage medium (including a compact disc, a laser disc, an optical disc, a digital versatile disc, a BLU-RAY disc, or the like), or magnetic disk storage medium, another magnetic storage device, or any other medium that can be configured to carry or store expected program code in a form of an instruction or a data structure and that can be accessed by the apparatus, but is not limited thereto. The memory may independently exist and be connected to the processor using the bus. Alternatively, the memory 93 may be integrated with the processor 91.

In a specific implementation, in an embodiment, the processor 91 may include one or more CPUs, for example, a CPU 0 and a CPU 1 in FIG. 9.

In a specific implementation, control device software is used as practical program code, and is controlled and executed by the processor 91. The processor 91 is configured to execute the application program code stored in the memory 93.

The apparatus 900 may include a plurality of processors, such as the processor 91 and a processor 98 in FIG. 9. Each of these processors may be a single-core (single-CPU) processor, or may be a multi-core (multi-CPU) processor. The processor 91 herein may be one or more devices or circuits, and/or a processing core configured to process data (for example, a computer program instruction).

In this embodiment of this application, the foregoing apparatus may be divided into functional modules based on the foregoing examples. For example, the functional modules may be divided corresponding to the functions, or two or more functions may be integrated into one processing module. The integrated module may be implemented in a form of hardware, or may be implemented in a form of a software functional module. It should be noted that module division in this embodiment of this application is an example and is merely logical function division. During actual implementation, there may be another division manner.

Figure 10:
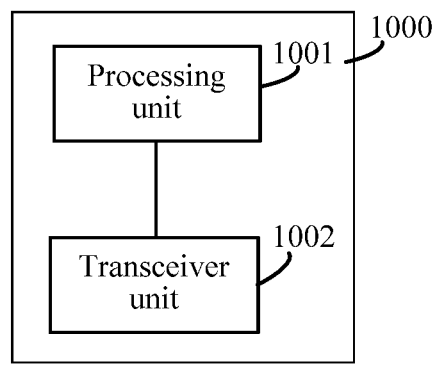
FIG. 10 is a schematic structural diagram of an apparatus according to an embodiment of this application.

For example, when the functional modules are divided corresponding to the functions, FIG. 10 is a possible schematic structural diagram of the apparatus 900 used in the foregoing embodiment. The apparatus 1000 includes a processing unit 1001 and a transceiver unit 1002. The transceiver unit 1002 is configured to receive a signal processed by the processing unit 1001. The apparatus may be the apparatus 900 in the foregoing embodiment.

In a possible design, the transceiver unit 1002 is configured to receive a voltage difference sampling value and a temperature sampling value that are output by a signal output terminal of a circuit breaker. The voltage difference sampling value is a voltage difference between a first voltage sampling point and a second voltage sampling point of the current detection unit, and the temperature sampling value is a temperature collected by a temperature detection element of the current detection unit.

The processing unit 1001 is configured to calculate, based on the voltage difference sampling value and the temperature sampling value, a current that flows through the miniature circuit breaker.

In a possible design, the processing unit 1001 is further configured to start a high-temperature alarm when determining that the temperature sampling value is higher than a preset threshold. Therefore, the circuit breaker can be effectively prevented from firing.

In a simple embodiment, persons skilled in the art may figure out that the processing unit 1001 of the apparatus 1000 may be implemented using a processor, and the transceiver unit 1002 may be implemented using a transceiver. Further, the method performed by the processing unit 1001 may be performed by the processor invoking application program code stored in a memory. This is not limited in the embodiments of this application.

An embodiment of this application further provides a communications apparatus. The communications apparatus includes a processor and a memory. The memory stores a computer program. When the processor reads and executes the computer program stored in the memory, the communications apparatus is enabled to implement the method performed by the control device in the foregoing embodiments of this application.

An embodiment of this application further provides a chip. The chip is connected to a memory. The memory stores a computer program. The chip is configured to read and execute the computer program stored in the memory, to implement the method performed by the control device in the foregoing embodiments of this application.

An embodiment of this application further provides a computer storage media storing program code. The stored program code, when being executed by a processor, is configured to implement the method performed by the control device in the foregoing embodiments of this application.

An embodiment of this application further provides a computer program product. The computer program product includes a computer software instruction, and the computer software instruction may be loaded using a processor to implement the method performed by the control device in the foregoing embodiments of this application.

It may be clearly understood by persons skilled in the art that, reference may be made between descriptions of the embodiments provided in the present disclosure. For the purpose of convenient and brief description, for the functions of the apparatuses and the steps performed by the apparatuses provided in the embodiments of the present disclosure, reference may be made to the related descriptions in the method embodiments of the present disclosure, and details are not described herein again.

Although this application is described with reference to the embodiments, in a process of implementing this application that claims protection, persons skilled in the art may understand and implement another variation of the disclosed embodiments by viewing the accompanying drawings, disclosed content, and the accompanying claims. In the claims, "comprising" does not exclude another component or another step, and "a" or "one" does not exclude a meaning of plurality. A single processor or another unit may implement several functions enumerated in the claims. Some measures are recorded in dependent claims that are different from each other, but this does not mean that these measures cannot be combined to produce a better effect.

Persons skilled in the art should understand that the embodiments of this application may be provided as a method, an apparatus (device), or a computer program product. Therefore, this application may be in a form of hardware only embodiments, software only embodiments, or embodiments with a combination of software and hardware. They are collectively referred to as "modules" or "systems" herein. Moreover, this application may use a form of a computer program product that is implemented on one or more computer-usable storage media (including but not limited to a disk memory, a CD-ROM, an optical memory, and the like) that include computer usable program code. The computer program is stored/distributed in a proper medium and is provided as or used as a part of the hardware together with another hardware, or may also use another allocation form, such as using the Internet or another wired or wireless telecommunications system.

This application is described with reference to the flowcharts and/or block diagrams of the method, the apparatus (device), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device such that a series of operations and steps are performed on the computer or the other programmable device, thereby generating computer-implemented processing. Therefore, the instructions executed on the computer or the other programmable device provide steps for implementing a specific function in one or more processes in the flowcharts and/or in one or more blocks in the block diagrams.

Although this application is described with reference to specific features and the embodiments thereof, various modifications and combinations may be made to them without departing from the scope of this application. Correspondingly, the specification and accompanying drawings are merely example description of this application defined by the accompanying claims, and is considered as any of or all modifications, variations, combinations or equivalents that cover the scope of this application. Persons skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A miniature circuit breaker comprising:
    a current detection circuit; and
    a circuit breaker body, wherein the circuit breaker body and the current detection circuit are located in respectively independent cavities in the miniature circuit breaker and are electrically coupled to each other, wherein a first current flows from a first end of the circuit breaker body to a second end of the circuit breaker body through the current detection circuit, and
    wherein the current detection circuit comprises:
        a signal output terminal; and
        a voltage drop detection assembly comprising a first voltage sampling point and a second voltage sampling point, wherein the first voltage sampling point and the second voltage sampling point are coupled to the signal output terminal,
        wherein the signal output terminal is configured to output a voltage difference sampling value, and wherein the voltage difference sampling value is a voltage difference between the first voltage sampling point and the second voltage sampling point.

2. The miniature circuit breaker of claim 1, wherein the current detection circuit further comprises a printed circuit board (PCB), and wherein the first voltage sampling point, the second voltage sampling point, and the signal output terminal are all disposed on the PCB.

3. The miniature circuit breaker of claim 2, wherein the current detection circuit further comprises a first busbar and a second busbar, wherein circuit breaker body comprises a first power connecting terminal and a magnetic tripping element coil, wherein a first end of the PCB is coupled, using a first end of the first busbar, to the first busbar and a second end of the PCB is coupled, using a first end of the second busbar, to the second busbar to transfer a second current from the first busbar to the second busbar, wherein a second end of the first busbar is coupled to the first power connecting terminal to transfer a third current from the first power connecting terminal to the PCB, and wherein a second end of the second busbar is coupled to the magnetic tripping element coil to transfer a fourth current from the PCB to the second end of the circuit breaker body using the magnetic tripping element coil.

4. The miniature circuit breaker of claim 3, wherein the first busbar and the second busbar are disposed at intervals on the PCB, wherein the first voltage sampling point is proximate to the first busbar, and wherein the second voltage sampling point is proximate to the second busbar.

5. The miniature circuit breaker of claim 4, wherein the current detection circuit further comprises a temperature detection element welded to the PCB and coupled to the signal output terminal, and wherein the temperature detection element is configured to:
    collect a temperature of the PCB;
    store the temperature of the PCB as a temperature sampling value; and
    provide the temperature sampling value to the signal output terminal,
    wherein the signal output terminal is further configured to output the temperature sampling value received from the temperature detection element.

6. The miniature circuit breaker of claim 5, further comprising a plastic isolation panel configured to isolate the circuit breaker body and the current detection circuit into different cavities.

7. The miniature circuit breaker of claim 6, wherein the circuit breaker body further comprises a contact system, a bimetallic finger, and a second power connecting terminal, wherein the magnetic tripping element coil is further coupled to the contact system, wherein the contact system is further coupled to the bimetallic finger, wherein the bimetallic finger is further coupled to the second power connecting terminal, and wherein a current input into the magnetic tripping element coil is configured to input into the second power connecting terminal after propagating through the contact system and the bimetallic finger.

8. The miniature circuit breaker of claim 2, wherein the current detection circuit further comprises a current divider, a first busbar, and a second busbar, wherein the circuit breaker body comprises a first power connecting terminal and a magnetic tripping element coil, wherein a first end of the current divider is coupled, using the PCB and a first end of the first busbar, to the first busbar and a second end of the current divider is coupled, using the PCB and a first end of the second busbar, to the second busbar to transfer a second current from the first busbar to the second busbar, wherein a second end of the first busbar is coupled to the first power connecting terminal to transfer a third current from the first power connecting terminal to the current divider, and wherein a second end of the second busbar is coupled to the magnetic tripping element coil to transfer a fourth current from the current divider to the second end of the circuit breaker body using the magnetic tripping element coil.

9. The miniature circuit breaker of claim 8, wherein the first voltage sampling point is disposed proximate to the first end of the current divider, and wherein the second voltage sampling point is disposed proximate to the second end of the current divider.

10. The miniature circuit breaker of claim 9, wherein the first voltage sampling point is located in a first welding region between the current divider and the PCB, wherein the second voltage sampling point is located in a second welding region between the current divider and the PCB, wherein the first welding region is proximate to the first busbar, and wherein the second welding region is proximate to the second busbar.

11. A control system comprising:
a control device; and
a miniature circuit breaker coupled to the control device and configured to output, using a signal output terminal, a voltage difference sampling value and a temperature sampling value to the control device, wherein the voltage difference sampling value is a voltage difference between a first voltage sampling point and a second voltage sampling point of a current detection circuit, wherein the current detection circuit comprises a printed circuit board (PCB), wherein the first voltage sampling point, the second voltage sampling point, and the signal output terminal are all disposed on the PCB, wherein the temperature sampling value is a temperature collected by a temperature detection element of the current detection circuit, and
wherein the control device is configured to:
obtain the voltage difference sampling value and the temperature sampling value from the miniature circuit breaker; and
obtain, based on the voltage difference sampling value and the temperature sampling value, a first current that flows through the miniature circuit breaker.

12. The control system of claim 11, wherein the temperature sampling value is higher than a preset threshold, and wherein the control device is further configured to start a high-temperature alarm.

13. The control system of claim 11, wherein the current detection circuit further comprises a first busbar and a second busbar, wherein the miniature circuit breaker further comprises a power connecting terminal and a magnetic tripping element coil, wherein a first end of the PCB is coupled, using a first end of the first busbar, to the first busbar and a second end of the PCB is coupled, using a first end of the second busbar, to the second busbar to transfer a second current from the first busbar to the second busbar, wherein a second end of the first busbar is coupled to the power connecting terminal to transfer a third current from the power connecting terminal to the PCB, and wherein a second end of the second busbar is coupled to the magnetic tripping element coil to transfer a fourth current from the PCB to a circuit breaker body using the magnetic tripping element coil.

14. The control system of claim 13, wherein the first busbar and the second busbar are disposed at intervals on the PCB, wherein the first voltage sampling point is proximate to the first busbar, and wherein the second voltage sampling point is proximate to the second busbar.

15. The control system of claim 11, wherein the temperature detection element is welded to the PCB and coupled to the signal output terminal.

16. A control method, implemented by a control device, the control method comprising:
obtaining a voltage difference sampling value and a temperature sampling value from a signal output terminal of a circuit breaker,
wherein the voltage difference sampling value is a voltage difference between a first voltage sampling point and a second voltage sampling point of a current detection circuit, wherein the current detection circuit comprises a printed circuit board (PCB), wherein the first voltage sampling point, the second voltage sampling point, and the signal output terminal are all disposed on the PCB, and wherein the temperature sampling value is a temperature collected by a temperature detection element of the current detection circuit; and
obtaining, based on the voltage difference sampling value and the temperature sampling value, a first current that flows through the miniature circuit breaker.

17. The control method of claim 16, wherein the temperature sampling value is higher than a preset threshold, and wherein the control method further comprises starting a high-temperature alarm.

18. The control method of claim 16, wherein the current detection circuit further comprises a first busbar and a second busbar, wherein the circuit breaker further comprises a power connecting terminal and a magnetic tripping element coil, wherein a first end of the PCB is coupled, using a first end of the first busbar, to the first busbar and a second end of the PCB is coupled, using a first end of the second busbar, to the second busbar to transfer a second current from the first busbar to the second busbar, wherein a second end of the first busbar is coupled to the power connecting terminal to transfer a third current from the power connecting terminal to the PCB, and wherein a second end of the second busbar is coupled to the magnetic tripping element coil to transfer a fourth current from the PCB to a circuit breaker body using the magnetic tripping element coil.

19. The control method of claim 18, wherein the first busbar and the second busbar are disposed at intervals on the PCB, wherein the first voltage sampling point is proximate to the first busbar, and wherein the second voltage sampling point is proximate to the second busbar.

20. The control method of claim 16, wherein the temperature detection element is welded to the PCB and coupled to the signal output terminal.

* * * * *